United States Patent [19]

Sibovits et al.

[11] Patent Number: 4,677,352

[45] Date of Patent: Jun. 30, 1987

[54] HIGH SPEED FLYBACK CIRCUIT FOR MAGNETIC YOKE

[75] Inventors: Jacob Sibovits, Flushing, N.Y.; I. Phillip Jenkins, Montville, N.J.

[73] Assignee: Allied Corporation, Morris Township, Morris County, N.J.

[21] Appl. No.: 745,542

[22] Filed: Jun. 17, 1985

[51] Int. Cl.[4] .............................................. H01J 29/70
[52] U.S. Cl. .................................... 315/408; 315/403; 315/396; 315/406
[58] Field of Search ................ 315/408, 403, 396, 406

[56] References Cited

U.S. PATENT DOCUMENTS

| | | | |
|---|---|---|---|
| 3,751,706 | 8/1973 | Owens, Jr. et al. | 315/383 |
| 3,917,977 | 11/1975 | Izumisawa | 315/395 |
| 3,979,641 | 9/1976 | Arakawa et al. | 315/397 |
| 4,164,689 | 8/1979 | Zappala | 315/408 |
| 4,297,621 | 10/1981 | Spilsbury | 315/403 |
| 4,361,785 | 11/1982 | Stapleton | 315/389 |
| 4,400,652 | 8/1983 | Sunderland | 315/387 |
| 4,456,856 | 6/1984 | Klinger | 315/408 |
| 4,556,825 | 12/1985 | Thomas | 315/408 |
| 4,581,564 | 4/1986 | Gassler | 315/408 |

OTHER PUBLICATIONS

Siliconix, MOSPOWER Design Catalog Jan. 1983.

Primary Examiner—Theodore M. Blum
Assistant Examiner—David Cain
Attorney, Agent, or Firm—Stan Protigal; Howard Massung

[57] ABSTRACT

A deflection drive circuit (15) for an inductive yoke (11) used with a raster scanned cathode ray tube rapidly interrupts current then reverses voltage applied to the yoke (11) during flyback. MOSFETs (Q32, Q47) are used to control current flow to the yoke. The current is interrupted by one MOSFET (Q32) being gated "OFF", after which current is permitted to flow to a capacitor (C51). At a preselected time, a second MOSFET (Q47) is gated on to admit reverse flow of current from the capacitor (C51) to the yoke (11). The second MOSFET (Q47) is gated "ON" by a circuit which includes a third MOSFET (Q57) and a pulse transformer (T59).

Advantages include an ability to rapidly effect flyback without interfering with the forward scanning ability of the deflection drive circuit 15.

10 Claims, 3 Drawing Figures

HIGH SPEED FLYBACK CIRCUIT FOR MAGNETIC YOKE

BACKGROUND OF THE INVENTION

This invention relates to inductive circuits and, in particular, to circuitry used to drive a deflection yoke for controlling movement of an electron beam in a cathode ray tube (CRT). More specifically, the invention relates to a flyback circuit which enables the deflection yoke to rapidly move the beam from the end of one line trace to the beginning of a subsequent line trace during raster scanning.

A problem inherent in using inductive loads is that rapid changes in current through such a load is met with the characteristic impedance of the load. In order to change the current flow through the load, a substantial increase in potential across the load over a transient time period is necessary in order to effect the change in current rapidly. Some systems using inductive loads must provide power to the load up to a certain maximum amount for the majority of operating time and must provide a substantially increased amount of power to the load for short periods of time. Such circuits include electric motors, and electron beam deflection devices such as video systems which use a magnetic coil deflection yoke.

In certain techniques used to obtain an increase in line resolution at a given frame rate, it is necessary to reduce the time allocated for flyback. In order to accomplish this, flyback boost circuits are used, which increase potential (voltage) to a magnetic deflection yoke in order to cause a rapid change in the yoke's magnetic field. This is because, at higher raster line rates, the time allocated for flyback decreases. If the actual deflection of an electron beam deflected by the yoke lags behind the time allocated for flyback, the result is a distortion on the left side of a screen (assuming a left-to-right horizontal line scan). This would cause the picture to appear stretched or to fold over.

Deflection circuits provide the additional energy needed typically by switching on high voltage across the yoke. High voltage switching must be triggered during flyback. In order to accomplish this, flyback circuits usually require that switching electronics anticipate yoke voltages, in order to be fully conductive when flyback power is to be applied to the yoke. This increases power consumption at the output of the deflection drive circuitry.

Further demands on flyback boost circuits occur when both raster and stroke information are to be displayed. Typically, stroke information is displayed during vertical retrace periods or as a selected alternative to a raster display. Such stroke information involves specific controls of the deflection yoke circuitry and the prior art flyback boost circuits would have to be electrically taken out of the yoke driving amplifiers during such time as stroke writing was used in order to eliminate a degrading effect on the stroke image.

Typical deflection amplifier design utilizes NPN and PNP bipolar power transistors. A problem with such designs is that, when current in the yoke is reversed during flyback, the reversal of current produces a large negative potential (voltage) which will keep NPN emitter voltage lower than the NPN base voltage, and therefore, will keep the NPN transistor on and cause the PNP transistor to saturate. This extends the time required for flyback and can result in a distorted raster display. Additionally, this design results in unnecessary power losses. The use of bipolar power transistors creates further problems because of the large base drive current such a transistor must have before the transistor is fully conductive. The desaturation of the transistor takes time. While not significant in overall power consumption, driving of the base consumes enough current to demand a significant output from a control device.

This invention has, as a principle object, decreased flyback time in order to facilitate increased resolution. It is important that circuitry used to increase flyback time not have a degrading effect on a CRT image produced by stroke writing. It is further important that such a circuit be simple enough in design as to not require separate adjustment. It is accordingly an object of the present invention to provide, to an inductive load, a stable linear current which is proportional to an input driving signal. It is a further object of the invention to enable a deflection amplifier for a cathode ray tube to operate at higher speeds in both a raster scan mode and a stroke writing mode. It is a futher object of the invention to provide a deflection amplifier which consumes a reduced amount of power.

SUMMARY OF THE INVENTION

In accordance with the present invention, a deflection amplifier is provided with a circuit in which a field effect transistor such as a metal oxide semiconductor field effect transistor (MOSFET) is used for controlling electromotive force (EMF, potential or voltage) to an inductive load such as a deflection yoke, in which rapid changes in current through the inductive load are desired.

In a preferred embodiment of the invention, a deflection circuit incorporating an electromagnetic yoke is arranged so that flyback can be initiated by rapidly interrupting current supplied to the yoke. Current is then permitted to flow from the yoke, through a MOSFET by virtue of its diode characteristic to a flyback capacitor. When yoke current is approximately zero, the MOSFET is switched on and current is rapidly admitted to the yoke.

In a further aspect of the invention, potential to drive the MOSFET is provided by a high speed pulse transformer. The transformer is, itself controlled by a MOSFET.

In an alternate embodiment of the invention, a deflection circuit incorporating an electromagnetic yoke is arranged so that flyback can be initiated by using a field effect transistor such as a MOSFET to rapidly interrupt current supplied to the yoke. Current is then permitted to flow from the yoke, through a diode circuit. When yoke current is approximately zero, current is rapidly admitted to the yoke past the diode circuit.

The advantages of using a MOSFET transistor are that it has excellent off-state characteristics and requires insignificant drive current. As a result, flyback EMF is switched on and off rapidly and flyback time becomes a function primarily of the EMF. Because of the rapid switching accomplished by the MOSFET, power efficiency is increased.

DETAILED DESCRIPTION OF THE PREFERRED EMBODIMENT

Figure 1:
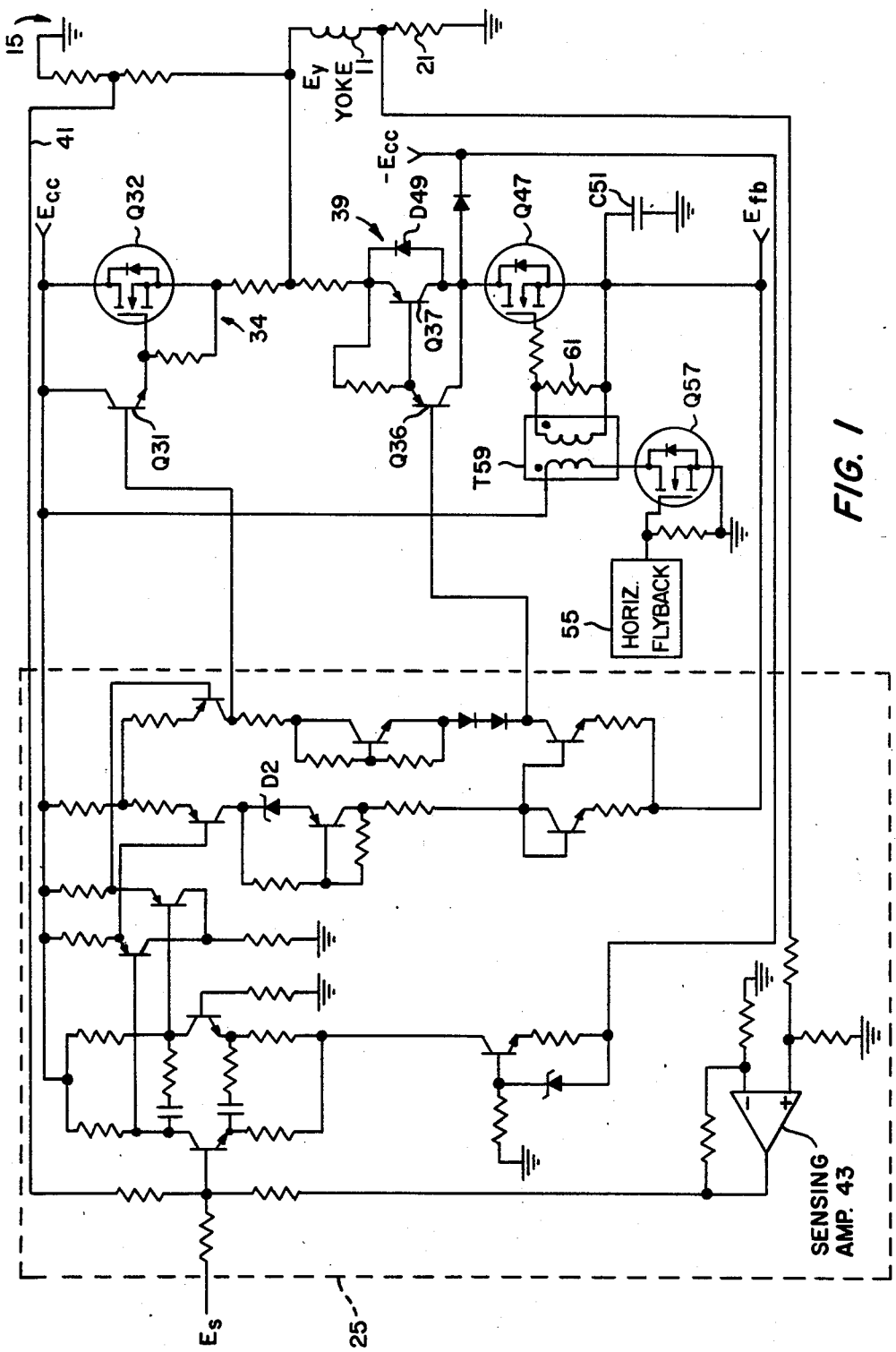
FIG. 1 shows a circuit arrangment utilizing a preferred embodiment of the present invention.

The present invention is intended to provide current to a load which, in the preferred embodiment, is a magnetic deflection yoke 11. The yoke 11 is mounted on the neck of a cathode ray tube (CRT, not shown) for the purpose of deflecting an electron beam in scanning the CRT. Current to the yoke 11 is supplied by a deflection drive circuit 15 which, in the present invention, incorporates the yoke 11.

In order to provide current to the yoke 11, the deflection drive circuit must provide a electromotive force (EMF, potential or voltage) across the yoke 11, which may be measured between point $E_y$ and point $E_g$. Point $E_g$ is isolated from ground by a small resistance 21 in order to provide an indication of current through the yoke 11. Referring to both FIGS. 2A and 2B, at a time period of between approximately $2\mu$ seconds (microseconds) to approximately $12\mu$ seconds, flyback is caused to occur. To accomplish this, current i through the yoke 11 is caused to reverse from approximately plus 3.5 amperes to approximately minus 3.5 amperes, with most of this change in current occuring within a time period of approximately $4\mu$ seconds. Current through the yoke 11 lags behind change in control signal potential because the yoke 11 is an inductive load. Therefore, it is desirable that potential across the yoke 11 change as rapidly as possible at the beginning of a flyback mode of operation. The flyback mode is indicated on FIGS. 2 as beginning at $t=0$ and ending at approximately $t=4\mu$ seconds and occurring again at approximately $t=38\mu$ seconds through $t=42\mu$ seconds.

In order to accomplish this, the deflection circuitry 15 provides the yoke 11 with current which varies in accordance with a control signal $E_s$. The control signal $E_s$ is processed by a control amplifier 25 which provides output signals to control transistor pair Q31 and Q32 in circuit 34 and to control transistor pair Q36 and Q37 in Darlington circuit 39. Circuits 34 and 39 conduct scanning potentials, $E_{cc}$ and $-E_{cc}$, respectively, to an output $E_y$. The output $E_y$ is supplied to the yoke 11 in order to drive the yoke 11 in its scanning mode. The control amplifier 25 receives a feedback signal corresponding to potential across the yoke 11 by means of line 41. A feedback signal corresponding to current through the yoke 11 is provided by sensing amplifier 43.

Figure 2A:
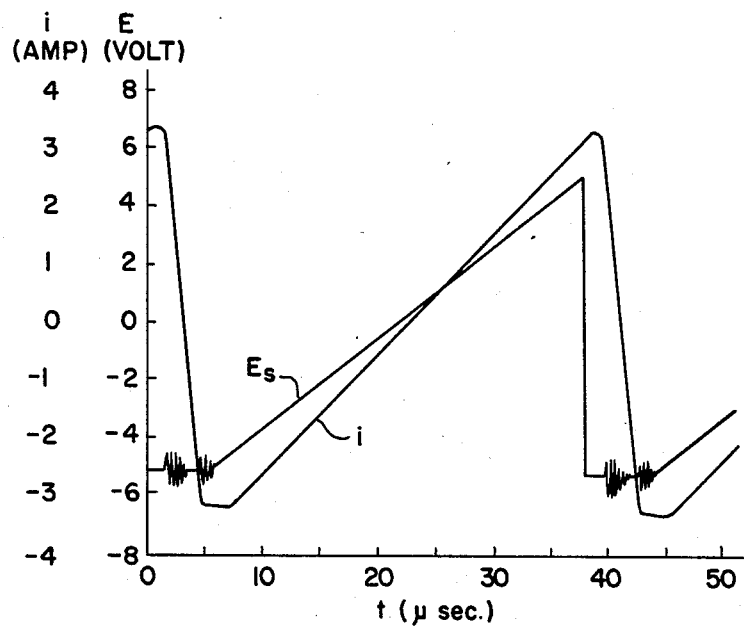
FIG. 2A is a graphic display of potential applied as a control signal to a deflection circuit vs. time superimposed with a graphic display of current flowing through the deflection yoke driven by the control circuit during the same time.

As can be seen in FIGS. 2, in the flyback mode, the control signal $E_s$ changes rapidly. The current i through the yoke 11, indicated by lines i in FIGS. 2 must follow the control signal $E_s$ during normal scan between flyback periods. This is indicated in FIG. 2A between $t=8$ and $t=39\mu$ seconds. In order to accomplish this, the current through the yoke must be brought to the appropriate level for beginning a line trace. This level is shown in FIG. 2A as approximately $-3.2$ amperes, seen at $t=8$ and $t=46\mu$ seconds.

Referring to FIG. 1, drive potentials $E_{cc}$ and $-E_{cc}$ are applied to the yoke 11 through Circuits 34 and 39 in order to drive the yoke 11 during forward scanning. During flyback, it is necessary to apply a potential $E_{fb}$ which has a greater negative potential magnitude than the negative potential $-E_{cc}$ for maintaining the desired current through the yoke 11 at the beginning of the scan period. For example, in the preferred embodiment, $E_{cc}=+32$ volts, $-E_{cc}=-32$ volts and $E_{fb}=-150$ volts in a quiescent state. This flyback potential $E_{fb}$ is gated to the yoke 11 by a power transmitting transistor Q47 which, in the preferred embodiment, is a field effect transistor, preferably a metal oxide semiconductor field effect transistor (MOSFET). MOSFET Q47 has a diode characteristic, allowing current to flow between Q37 and $E_{fb}$ when potential at $E_{fb}$ is more positive than the potential between MOSFET 47 and transistor Q37.

Figure 2B:
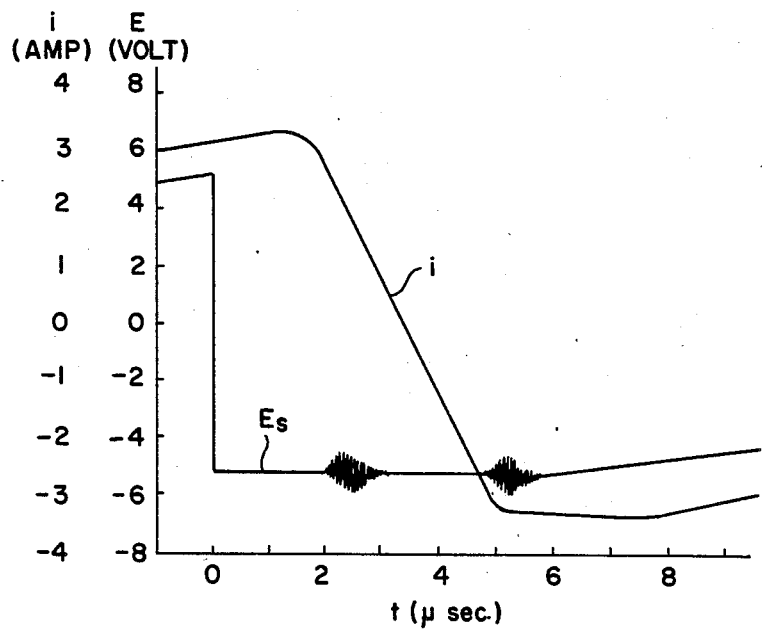
FIG. 2B is an expanded view of a portion of FIG. 2A, showing details of the control signal potential and yoke current during flyback.

At initialization of flyback, indicated in FIG. 2B at $t=0$, current is flowing in what is defined as a positive direction through the yoke 11. At approximately $t=1\mu$ seconds, current through the yoke 11 is caused to reverse. This is accomplished by the control amplifier 25 switching off circuit 34. Transistor Q32, which is the power transistor in circuit 34, is preferably also a MOSFET. At the initialization of the flyback mode, Q32 is gated off and rapidly interrupts current flow between $E_{cc}$ and the yoke 11. At this time, the potential $E_y$ rapidly changes to a negative value and conducts through diode D49 and MOSFET Q47 to a flyback capacitor C51. Current flows through MOSFET Q47 by virtue of the diode characteristic of the MOSFET.

Flyback capacitor C51 is a low-loss capacitor which stores the energy released from the yoke for power conservation. At a preselected time, when the current through the yoke 11 has reduced to zero, MOSFET Q47 is gated on, thereby conducting the potential from $E_{fb}$ together with the energy that was stored in the capacitor C51 to the yoke 11 at $E_y$. This causes current in the yoke 11 to continue to reverse, thereby bringing the current through the yoke 11 to a desired value at the end of flyback.

At the end of the flyback mode, MOSFET Q47 gates off and current through the yoke 11 is controlled by the control amplifier 25 in accordance with the control signal $E_s$. At that time, circuits 34 and 39 supply the appropriate potential levels to the yoke 11 at $E_y$ during the scanning mode. In the scanning mode, MOSFET Q32 is operated as a linear amplifier device, rather than as an on/off switch. This permits circuit 34 to be used to rapidly gate off, thereby initiating flyback, while at the same time operating to control horizontal scanning in either forward raster scanning or stroke writing mode.

MOSFET Q47 is gated on in response to a signal from a horizontal flyback circuit 55. The horizontal flyback circuit 55 merely provides a timing signal, preferably in timed response to a synchronization signal.

A field effect transistor, preferably a MOSFET Q57, is used to momentarily conduct current through a primary winding of a transformer T59. The transformer T59 has a secondary winding which is connected in series between the gate of MOSFET Q47 and $E_{fb}$. With the primary winding of the transformer T59 open, potential at the gate of MOSFET Q47 remains at $E_{fb}$. MOSFET Q57 gates on and then off to cause the potential at the gate of MOSFET Q47 to increase in value momentarily. At that time, the transformer T59 behaves as a pulse transformer and rapidly gates on MOSFET Q47 for a period of time determined by the horizontal flyback timing signal.

The transformer T59 is preferably an air core transformer, and allows the MOSFET Q47 to be conducted for a predetermined period of time, as controlled by MOSFET Q57.

The foregoing is a preferred embodiment given as an example only. As will be clear to people skilled in design of electronic circuits, sundry modifications can be made to the specific circuit while still retaining the inventive features described.

We claim:

1. Circuit for controlling current through an inductive load, characterized by:
   (a) normal output means, including a first field effect transistor, operative to control current through the inductive load in a first mode of circuit operation, said means providing potential levels sufficient to provide current in at least one direction to the yoke in said first mode;
   (b) means, including the first field effect transistor, operative to control current through the inductive load in a second mode of circuit operation, the field effect transistor interrupting current in said one direction during said second mode;
   (c) a second field effect transistor to admit current to flow through the yoke when current is interrupted by said field effect transistor, thereby causing current flow through the inductive load to rapidly change during said second mode;
   (d) a second mode potential source connected to the second field effect transistor; and
   (e) means to gate the second field effect transistor on in order to admit current from a second mode potential source, said means to gate the second field effect transistor including a transformer connected to provide a pulse output to a gate of the second field effect transistor, whereby
   during one time period of said second mode, the second field effect transistor admits current to flow therethrough by behaving as a diode and during another time period of said second mode, the second field effect transistor admits current to flow between the second mode potential source and the inductive load.

2. Circuit as described in claim 1, further characterized by:
   a capacitor;
   the second field effect transistor to admit current to flow being connected between the inductive load and the capacitor, wherein the capacitor stores energy from said current flow during said second mode.

3. Circuit is described in claim 1, further characterized by:
   a third field effect transistor connected to a primary circuit of the pulse transformer for controlling the output of the pulse transformer.

4. Circuit as described in claim 2, further characterized by:
   a third field effect transistor connected to a primary circuit of the pulse transformer for controlling the output of the pulse transformer.

5. Apparatus as defined in claim 1, further characterized by:
   means to establish a preselected time at which said one time period terminates and said other time period is initiated.

6. Apparatus as defined in claim 2, further characterized by:
   means to establish a preselected time at which said one time period terminates and said other time period is initiated.

7. Apparatus as defined in claim 2, further characterized by:
   means to establish a preselected time at which said one time period terminates and said other time period is initiated.

8. Circuit for controlling current through an inductive load, characterized by:
   (a) normal output means, including a first field effect transistor, operative to control current through the inductive load in a firse mode of circuit operation, said means providing potential levels sufficient to provide current in at least one direction tot he inductive load in said first mode;
   (b) means, including the first field effect transistor, operative to control current through the inductive load in a second mode of circuit operation, the field effect transistor interrupting current in said one direction during said second mode;
   (c) a second field effect transistor to admit current to flow through the inductive load when current is interrupted by said first field effect transistor, thereby causing current flow through the inductive load to rapidly change during said second mode;
   (d) a second mode potential source connected to the second field effect transistor; and
   (e) means to gate the second field effect transistor on in order to admit current from a second mode potential source, whereby during one time period of said second mode, the second field effect transistor admits current to flow therethrough by behaving as a diode and during another time period of said second mode, the second field effect transistor admits current to flow between the second mode potential source and the inductive load; and
   (f) means to establish a preselected time at which said one time period terminates and said other time period is initiated.

9. Circuit as described in claim 7, further characterized by:
   a capacitor;
   the second field effect transistor to admit current to flow being connected between the inductive load and the capacitor, wherein the capacitor stores energy from said current flow during said second field effect transistor mode.

10. Circuit as described in claim 7, further characterized by:
    said means to gate the second field effect transistor including a transformer connected to provide a pulse output to a gate of the second field effect transistor; and
    a third field effect transistor connected to a primary circuit of the pulse transformer for controlling the output of the pulse transformer.

* * * * *